(12) United States Patent
Kim

(10) Patent No.: US 11,829,016 B2
(45) Date of Patent: Nov. 28, 2023

(54) DISPLAY DEVICE

(71) Applicant: Samsung Display Co., LTD., Yongin-si (KR)

(72) Inventor: Yongil Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 162 days.

(21) Appl. No.: 16/859,410

(22) Filed: Apr. 27, 2020

(65) Prior Publication Data

US 2020/0341326 A1  Oct. 29, 2020

(30) Foreign Application Priority Data

Apr. 29, 2019 (KR) .................. 10-2019-0049699

(51) Int. Cl.
| | | |
|---|---|---|
| G02F 1/1333 | (2006.01) | |
| G02F 1/1335 | (2006.01) | |
| G02F 1/13357 | (2006.01) | |
| H10K 50/86 | (2023.01) | |
| H10K 50/84 | (2023.01) | |

(52) U.S. Cl.
CPC .. *G02F 1/133308* (2013.01); *G02F 1/133317* (2021.01); *G02F 1/133322* (2021.01); *G02F 1/133388* (2021.01); *G02F 1/133528* (2013.01); *G02F 1/133314* (2021.01); *G02F 1/133615* (2013.01); *G02F 2201/46* (2013.01); *G02F 2201/503* (2013.01); *H10K 50/841* (2023.02); *H10K 50/86* (2023.02)

(58) Field of Classification Search
CPC ......... G02F 1/133528; G02F 1/133308; G02F 1/133314; G02F 1/133317; G02F 1/133322; G02F 1/133388; G02F 1/133615; G02F 2201/46
See application file for complete search history.

(56) References Cited

U.S. PATENT DOCUMENTS

| | | | |
|---|---|---|---|
| 7,916,239 B2 * | 3/2011 | Tsubokura | G02F 1/133604 349/58 |
| 9,128,312 B2 | 9/2015 | Lee et al. | |
| 10,070,538 B2 | 9/2018 | Park et al. | |
| 2002/0192280 A1 | 12/2002 | Hunter et al. | |

FOREIGN PATENT DOCUMENTS

| | | |
|---|---|---|
| KR | 10-2016-0068031 | 6/2016 |
| KR | 10-1710188 | 2/2017 |
| KR | 10-1857251 | 5/2018 |

* cited by examiner

*Primary Examiner* — Paisley L Wilson
(74) *Attorney, Agent, or Firm* — KILE PARK REED & HOUTTEMAN PLLC

(57) ABSTRACT

A display device includes a display panel including a display surface on which an image is displayed, a film disposed above the display panel, a bottom chassis disposed under the display panel, a pole frame disposed under the bottom chassis, and a pole chassis. The pole frame includes a fixing portion and an elastic portion. The pole chassis is coupled with the elastic portion. The film includes a first portion disposed on the display panel and a second portion extending from the first portion and coupled to the pole chassis. The pole frame and the pole chassis cooperate to exert a force on the film, and thus the film may be extended to the bottom chassis from the display panel without being deformed.

14 Claims, 16 Drawing Sheets

DISPLAY DEVICE

CROSS-REFERENCE TO RELATED APPLICATION

This application claims priority under 35 U.S.C. § 119 of Korean Patent Application No. 10-2019-0049699, filed in the Korean Intellectual Property Office on Apr. 29, 2019, the entire contents of which are hereby incorporated herein by reference.

BACKGROUND

1. Field of the Disclosure

The disclosure relates to a display device including a polarizing film. More particularly, the disclosure relates to a display device including a polarizing film extending from an upper portion of a display panel to a bottom chassis thereof.

2. Description of the Related Art

In general, a display device, such as a monitor, a digital TV, and a smartphone, may include a polarizing film disposed on a display panel. The polarizing film may prevent an external light from being reflected by the display panel and may allow a user to correctly recognize an image displayed on the display panel.

However, a side frame that is disposed at a side of the display panel to fix the polarizing film may be recognized as a bezel area, and visibility at the side of the display panel may be lowered at the bezel area.

SUMMARY

The disclosure provides a display device having a polarizing film extending from an upper portion of a display panel to a bottom chassis to reduce a visibility of a side frame of a display panel.

An embodiment of the disclosure may provide a display device including a display panel, a bottom chassis, a pole frame, a pole chassis, and a film. The display panel may include a display surface on which an image may be displayed. The bottom chassis may be disposed under the display panel. The pole frame may be disposed under the bottom chassis and may include a fixing portion fixed to the bottom chassis and an elastic portion extending from the fixing portion. The pole chassis may be coupled with the elastic portion. The film may include a first portion disposed on the display panel and a second portion extending from the first portion and coupled to the pole chassis.

The elastic portion may exert a force in a predetermined direction on the pole chassis.

The display surface may include a center area and an edge area disposed around the center area. The predetermined direction may be a direction that may be substantially parallel to a direction from the edge area toward the center area.

The elastic portion of the pole frame may include a hook. The pole chassis may include a coupling portion corresponding to the hook and in which the hook couples the elastic portion of the pole frame to the coupling portion of the pole chassis.

The fixing portion of the pole frame may include a hook. The bottom chassis may include a coupling portion corresponding to the hook.

The pole chassis may be disposed between the bottom chassis and the pole frame. The film may include a polarizing film that polarizes a light incident thereto.

The pole frame may further include a stopper. The stopper may be disposed between the fixing portion and the elastic portion.

The display device may further include a backlight unit disposed between the display panel and the bottom chassis. The display panel may include a liquid crystal layer. The backlight unit may include a light guide member and a light source. The light guide member may include a front surface substantially parallel to the display surface, a rear surface opposite to the front surface, and side surfaces connecting the front surface and the rear surface. The light source may be disposed adjacent to a first side surface among the side surfaces. The film may be disposed around a second side surface extending from the first side surface among the side surfaces.

An embodiment of the disclosure may provide a display device including a display panel, a bottom chassis, a pole frame, a pole chassis, and a film. The display panel may include a display surface on which an image is displayed. The bottom chassis may be disposed under the display panel. The pole frame may include a fixing portion and an elastic portion. The fixing portion may be disposed under the bottom chassis and may be fixed to the bottom chassis. The elastic portion may extend from the fixing portion. The pole chassis may receive an force from the elastic portion in a predetermined direction. The film may include a first portion and a second portion. The first portion may be disposed on the display panel. The second portion may extend from the first portion and may be coupled to the pole chassis.

At least a portion of the elastic portion of the pole frame may be coupled with the pole chassis.

The display surface may include a center area and an edge area disposed around the center area. The predetermined direction may be a direction that is substantially parallel to a direction from the edge area toward the center area.

The elastic portion of the pole frame may include a hook, and the pole chassis may include a coupling portion corresponding to the hook and in which the hook couples the elastic portion of the pole frame to the coupling portion of the pole chassis.

The elastic portion of the pole frame may include a hook. The bottom chassis may include a coupling portion corresponding to the hook. The pole chassis may be disposed between the bottom chassis and the pole frame.

The pole frame may further include a stopper disposed between the fixing portion and the elastic portion.

An embodiment of the disclosure may provide a display device including a display panel, a bottom chassis, a pole frame, and a film. The display panel may include a display surface on which an image may be displayed. The bottom chassis may be disposed under the display panel include a bottom surface and a side surface. The bottom surface is substantially parallel to the display surface. The side surface may extend from the bottom surface to the display panel. The pole frame may include a body portion and an elastic portion. The body portion may be disposed on the side surface of the bottom chassis. The elastic portion may extend from the fixing portion to fix the side surface with the pole frame. The film may include a first portion and a second portion. The first portion may be disposed on the display panel, and the second portion may extend from the first portion and may be coupled to the pole frame.

The second portion of the film may receive an elastic force of the elastic portion in a direction extending toward a lower portion of the display panel, in response to the side surface of the bottom chassis being fixed with the pole frame.

The elastic portion of the pole frame may include an opening. The bottom chassis may include a coupling portion. The coupling portion may extend from the side surface of the bottom chassis and that is received in the opening to couple the pole frame and the bottom chassis.

The pole frame may further include a body portion disposed around the elastic portion and the coupling portion.

At least a portion of the side surface of the bottom chassis may include a convex portion protruded from the side surface. The convex portion may contact a portion of the second portion of the film.

According to the above, the visibility of the side frame of the display panel may be reduced.

BRIEF DESCRIPTION OF THE DRAWINGS

The above and other advantages of the disclosure will become readily apparent by reference to the following detailed description when considered in conjunction with the accompanying drawings, wherein.

DETAILED DESCRIPTION

Figure 1:
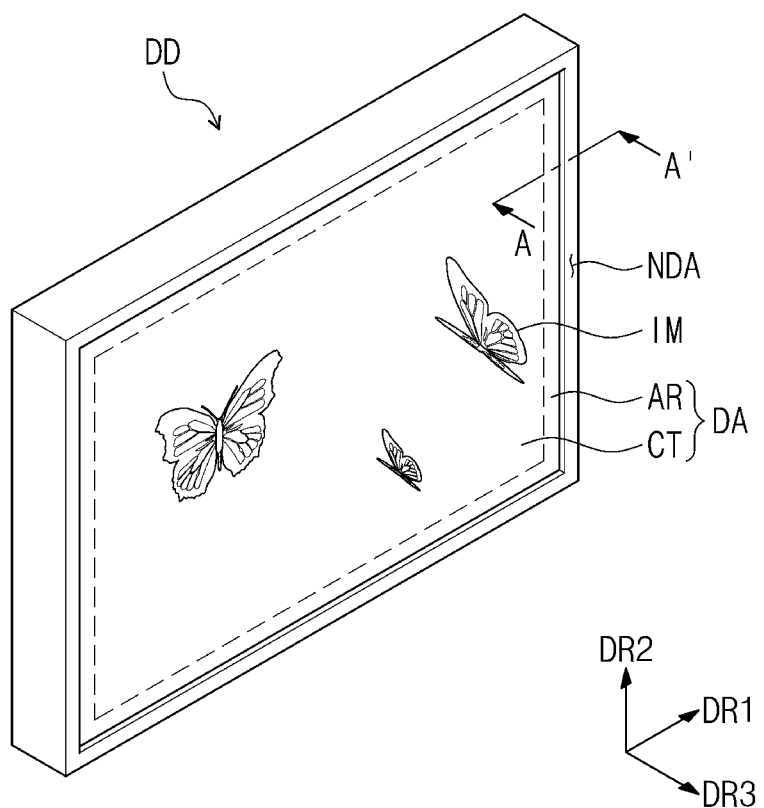
FIG. 1 illustrates a perspective view showing a display device according to an embodiment of the disclosure.

Hereinafter, embodiments of the disclosure will be explained in detail with reference to the accompanying drawings.

In the drawings, the thickness, ratio, and dimension of components are exaggerated for effective description of the technical content. As used herein, the term "and/or" includes any and all combinations of one or more of the associated listed items.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Hereinafter, for the convenience of explanation, an arbitrary direction may be referred to as a "first direction DR1", a direction perpendicular to the first direction DR1 may be referred to as a "second direction DR2", and a direction perpendicular to the first and second directions DR1 and DR2 may be referred to as a "third direction DR3". In the following descriptions, upper and lower portions are distinct from each other with respect to the third direction DR3.

Although aspects of the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure. Some of the parts which are not associated with the description may not be provided in order to describe various embodiments and like reference numerals refer to like elements throughout the specification.

Further, in the specification, the phrase "in a plan view" means when an object portion is viewed from above, and the phrase "in a schematic cross-sectional view" means when a cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first object may directly or indirectly oppose a second object. In a case in which a third object intervenes between the first and second object, the first and second objects may be understood as being indirectly opposed to one another, although still facing each other.

When a layer, region, substrate, or area, is referred to as being "on" another layer, region, substrate, or area, it may be directly on the other film, region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof. As used herein, the term "and/or" includes any and all combinations of one or more of the associated listed items.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
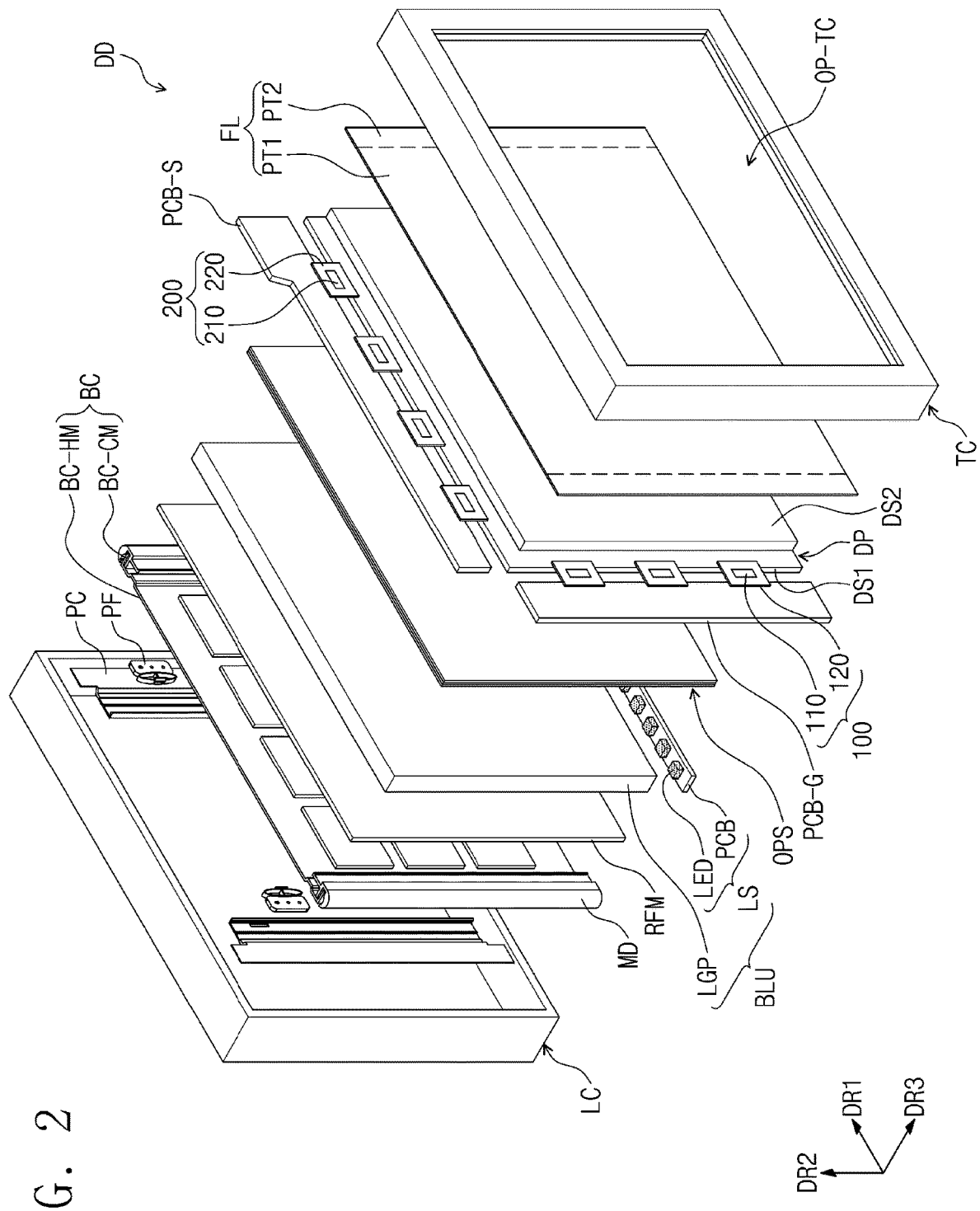
FIG. 2 illustrates an exploded perspective view showing a display device according to an embodiment of the disclosure.
Figure 3:
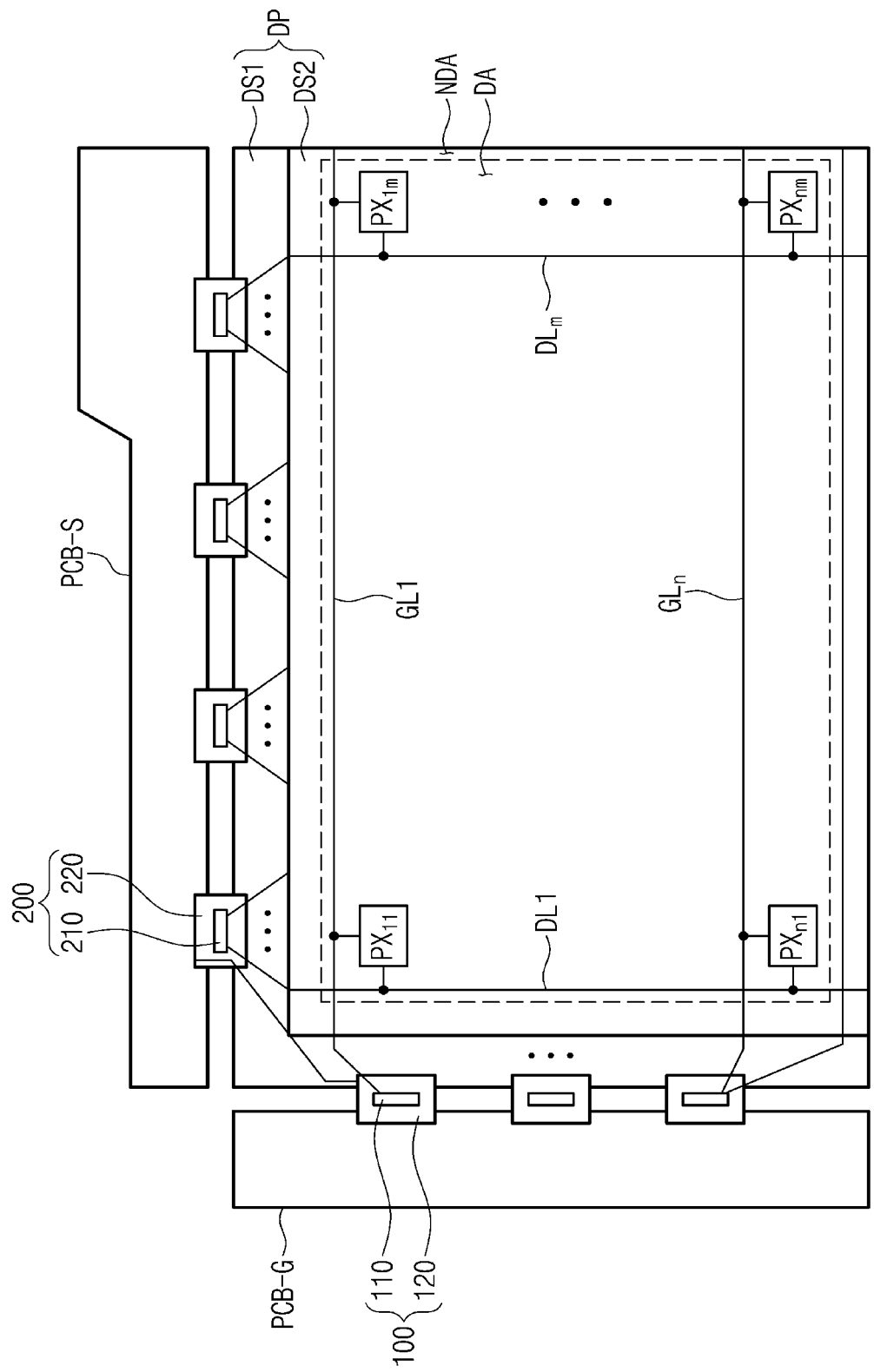
FIG. 3 illustrates a block diagram showing a display device according to an embodiment of the disclosure.

FIG. 1 illustrates a perspective view showing a display device DD according to an embodiment of the disclosure. FIG. 2 illustrates an exploded perspective view showing the display device DD according to an embodiment of the disclosure. FIG. 3 illustrates a block diagram showing the display device DD according to an embodiment of the disclosure.

Referring to FIGS. 1 and 2, the display device DD may include a top cover TC, a film FL, a display panel DP, a gate driving circuit 100, a data driving circuit 200, an optical member OPS, a backlight unit BLU, a reflective module RFM, a bottom chassis BC, a mold frame MD, a pole frame PF, a pole chassis PC, and a bottom cover LC.

As shown in FIG. 1, the display device DD may include a display surface DA and a non-display surface NDA. The display surface DA may be provided on a plane of the display panel DP, which may be substantially parallel to a plane defined by a first direction DR1 and a second direction DR2 perpendicular to the first direction DR1. The non-display surface NDA may be defined by the top cover TC. In a case where the display device DD does not include the top cover TC, the non-display surface NDA may be defined by a sealing member or a mold.

The display surface DA may include an edge area AR and a center area CT. The edge area AR may surround or be around a periphery of the center area CT. The display surface DA may provide a user with information about an image IM. FIG. 1 shows a butterfly as a representative example of the image IM.

The top cover TC may protect the display panel DP from external impacts or contaminants. The top cover TC may be provided with an opening OP-TC defined therethrough, and a front surface of the display panel DP exposed through the opening OP-TC of the top cover TC may be defined as the display surface DA.

The film FL may be disposed between the top cover TC and the display panel DP. The film FL may include a first portion PT1 and a second portion PT2. The first portion PT1 may be disposed on the display panel DP. The second portion PT2 may extend from the first portion PT1 and may be coupled to the pole chassis PC.

In the display device according to the embodiment of the disclosure, the film FL may be a polarizing film. The film FL may prevent a light incident from the outside from being reflected by the display panel DP. The user may correctly recognize the image IM displayed on the display surface DA since the external light may not be reflected by the display panel DP due to the film FL. Although not shown in figures, the film FL may include an adhesive material.

The display panel DP may be disposed under the film FL. For example, the display panel DP may be disposed between the film FL and the optical member OPS.

The display panel DP may display the image. The display panel DP according to the embodiment may not be limited to a particular configuration and may thus include a non-light emission type display panel that requires a separate light source, i.e., a transflective or transmissive type display panel.

The display panel DP may include a first substrate DS1, a second substrate DS2 facing the first substrate DS1, and a liquid crystal layer LCL (refer to FIG. 5) disposed between the first and second substrates DS1 and DS2. The liquid crystal layer LCL may include liquid crystal molecules whose alignment may be changed depending on an electric field formed between the first substrate DS1 and the second substrate DS2. The first substrate DS1 and the second substrate DS2 may include a glass material.

Although not shown in figures, polarizing plates may be disposed on and under the display panel DP, respectively. FIGS. 1 and 2 show the display panel DP as being flat, however, the display panel DP may not be limited thereto. For example, the display panel DP may be curved at a predetermined curvature.

The optical member OPS may be disposed under the display panel DP. For example, the optical member OPS may be disposed between the display panel DP and the backlight unit BLU.

The optical member OPS may include at least one of a diffusing plate, a diffuser, a first prism sheet (or a horizontal prism sheet), a second prism sheet (or a vertical prism sheet), and a brightness improving member.

The diffusing plate may diffuse a light incident thereto from a light source LS to the display panel DP. Accordingly, uniformity of the light emitted from the light source LS may be improved. The diffuser may diffuse the light incident thereto and may provide the diffused light to the display panel DP. The diffuser may have a sheet shape different from the diffusing plate. The first prism sheet may adjust a direction of the light incident thereto to the first direction DR1. For example, in a case where the first prism sheet is the horizontal prism sheet, the direction of the light may be adjusted to left and right directions.

The second prism sheet may adjust the direction of the light incident thereto to the second direction DR2 perpendicular to the first direction DR1. For example, in a case where the second prism sheet may be the vertical prism sheet, the direction of the light may be adjusted to up and down directions.

However, the type of the optical member OPS may not be limited thereto, and the optical member OPS may be a sheet to change or improve characteristics of the light incident thereto.

The backlight unit BLU may be disposed under the optical member OPS. For example, the backlight unit BLU may be disposed between the optical member OPS and the reflective module RFM.

The backlight unit BLU may provide the light to the display panel DP.

The backlight unit BLU may include a light guide member LGP and the light source LS.

The light guide member LGP may guide the light provided from the light source LS and may output the light to the display panel DP. The light guide member LGP may have a transparent property.

The light source LS may include point light sources LED and a printed circuit board PCB.

Each of the point light sources LED may include a light emitting diode (LED) chip. The LED chip may be mounted on the printed circuit board PCB and may emit the light in a visible light region.

The reflective module RFM may be disposed under the backlight unit BLU. For example, the reflective module RFM may be disposed between the backlight unit BLU and the bottom chassis BC.

The reflective module RFM may reflect the light exiting from the backlight unit BLU.

The reflective module RFM may make contact with the light guide member LGP, however, the reflective module RFM may not be limited thereto. That is, the reflective module RFM may be spaced apart from the light guide member LGP.

FIG. 2 illustrates an edge-illumination type backlight unit, however, the backlight unit may not be limited to the edge-illumination type backlight unit. For example, the backlight unit may be a direct-illumination type backlight unit (refer to FIG. 7).

The bottom chassis BC may be disposed under the reflective module RFM. For example, the bottom chassis BC may be disposed between the reflective module RFM and the pole frame PF. The bottom chassis BC may include a bottom surface BC-HM and a side surfaces BC-CM.

The bottom surface BC-HM of the bottom chassis BC may be disposed to be parallel to the display surface DA. The side surfaces BC-CM of the bottom chassis BC may extend from the bottom surface BC-HM to the display panel DP. The bottom chassis BC may support the display panel DP, the backlight unit BLU, and/or the reflective module RFM. The bottom chassis BC may include a metal material. Therefore, the bottom chassis BC may be machined by a sheet metal forming operation.

At least one of the side surfaces BC-CM of the bottom chassis BC may be coupled to the mold frame MD. The mold frame MD may include a curved portion. In a case that the second portion PT2 of the film FL may extend to the pole chassis PC, the second portion PT2 may extend over the curved portion of the mold frame MD. The second portion PT2 of the film FL may extend without being deformed, such as tearing or stretching, due to the mold frame MD.

The pole frame PF may be disposed under the bottom chassis BC. For example, the pole frame PF may be disposed between the bottom chassis BC and the pole chassis PC.

At least one pole frame PF may be disposed under the bottom chassis BC. Although not shown in figures, several pole frames PF may be disposed between the bottom chassis BC and the pole chassis PC. For example, perhaps six to about ten pole frames PF may be disposed between the bottom chassis BC and the pole chassis PC, however, the number of the pole frames PF may not be limited thereto.

The pole chassis PC may be disposed under the pole frame PF. For example, the pole chassis PC may be disposed between the pole frame PF and the bottom cover LC. The pole chassis PC may be coupled to the film FL.

The bottom cover LC may be disposed under the pole chassis PC. The bottom cover LC may protect the display device DD from external impacts or contaminants.

FIG. 3 illustrates a block diagram showing the display device DD shown in FIG. 1.

When viewed in a plan view, the display panel DP includes the display surface DA on which pixels $PX_{11}$ to $PX_{nm}$ may be arranged and the non-display surface NDA surrounding or being disposed around a periphery of the display surface DA.

The display panel DP may include gate lines GL1 to GLn disposed on the first substrate DS1 and data lines DL1 to DLm crossing the gate lines GL1 to GLn. The gate lines GL1 to GLn may be connected to the gate driving circuit 100. The data lines DL1 to DLm may be connected to the data driving circuit 200. FIG. 3 illustrates some gate lines among the gate lines GL1 to GLn and some data lines among the data lines DL1 to DLm. The display panel DP may further include a dummy gate line.

FIG. 3 illustrates some pixels among the pixels $PX_{11}$ to $PX_{nm}$. Each of the pixels $PX_{11}$ to $PX_{nm}$ may be connected to a corresponding gate line among the gate lines GL1 to GLn and a corresponding data line among the data lines DL1 to DLm. However, the dummy gate line GLd may not be connected to the pixels $PX_{11}$ to $PX_{nm}$.

The pixels $PX_{11}$ to $PX_{nm}$ may be grouped depending on colors displayed thereby. The pixels $PX_{11}$ to $PX_{nm}$ may display one of primary colors. The primary colors may include red, green, blue, and white colors. The primary colors may further include various colors, e.g., yellow, cyan, and magenta.

The gate driving circuit 100 and the data driving circuit 200 may receive a control signal from a signal controller, for instance, a timing controller. The gate driving circuit 100 may include a first driving chip 110 and a first flexible printed circuit board 120. The data driving circuit 200 may include a second driving chip 210 and a second flexible printed circuit board 220.

The signal controller may be mounted on a source printed circuit board PCB-S. The signal controller may receive image data and control signals from an external graphic controller (not shown). The control signals may include a vertical synchronization signal as a frame distinction signal to distinct frame periods, a horizontal synchronization signal as a row distinction signal to distinct horizontal periods, a data enable signal maintained at a high level during a period, in which data are output, to indicate a data input period, and clock signals.

The gate driving circuit 100 may generate gate signals based on a control signal (hereinafter, referred to as a "gate control signal") provided from the signal controller and may output the gate signals to the gate lines GL1 to GLn during the frame periods. The gate signals may be sequentially output to correspond to the horizontal periods.

FIG. 3 illustrates one gate driving circuit 100 connected to left ends of the gate lines GL1 to GLn as a representative example. A tape carrier package (TCP) type gate driving circuit 100 using a gate circuit board PCB-G may be a representative example, however, the gate driving circuit 100 may not be limited thereto. The gate driving circuit 100 may be substantially simultaneously formed with the pixels $PX_{11}$ to $PX_{nm}$ through a thin film process. For instance, the gate driving circuit 100 may be mounted on the non-display surface NDA in the form of amorphous silicon TFT gate driver circuit (ASG) or oxide semiconductor TFT gate driver circuit (OSG).

Figure 4:
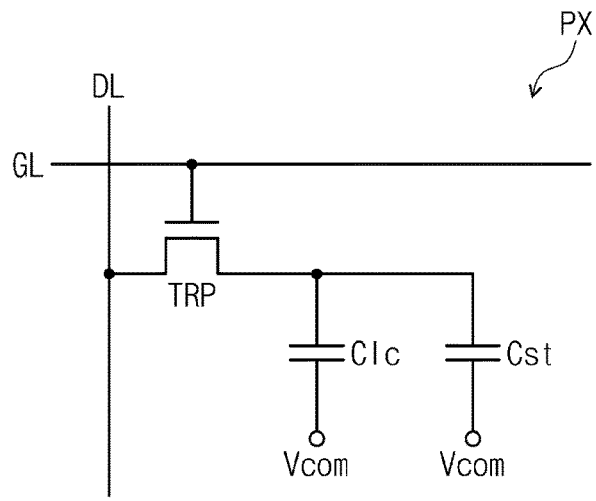
FIG. 4 illustrates schematic diagram of an equivalent circuit of a pixel according to an embodiment of the disclosure.
Figure 5:
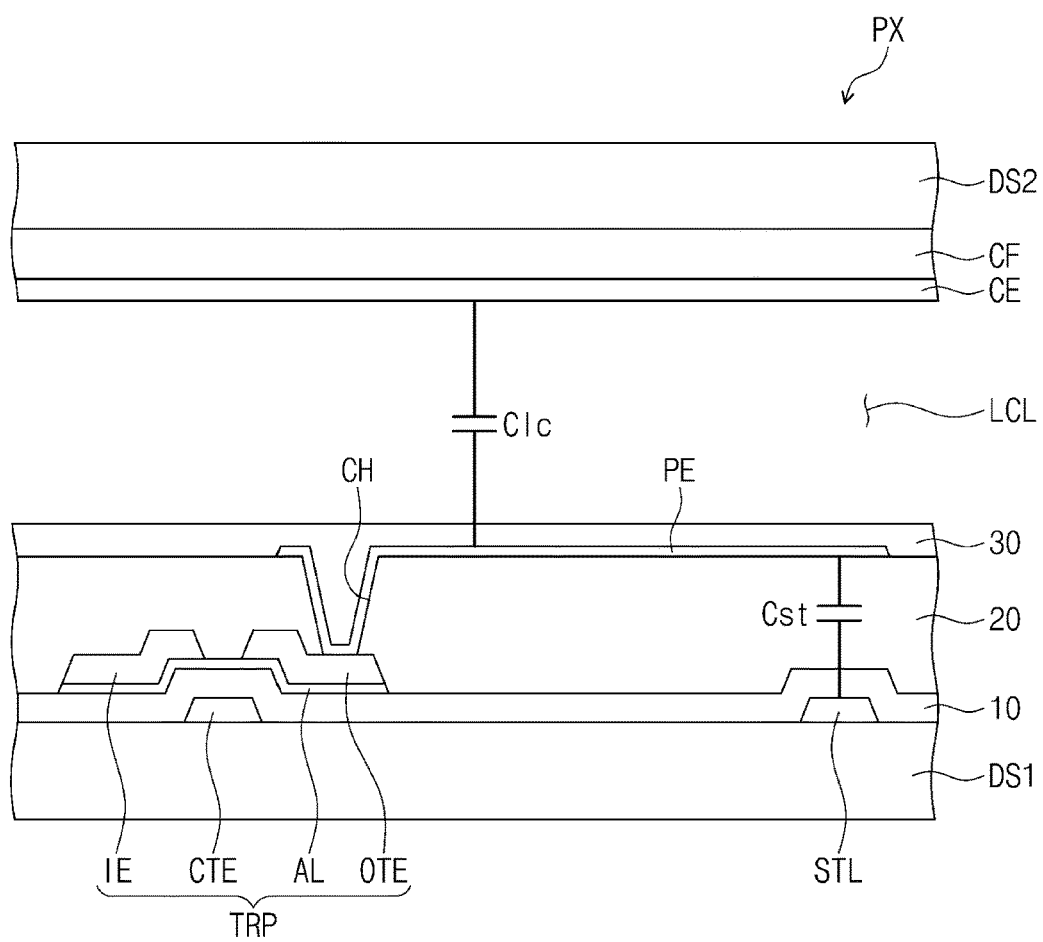
FIG. 5 illustrates a schematic cross-sectional view taken along line AA' and showing an equivalent circuit of a pixel according to an embodiment of the disclosure.

FIG. 4 illustrates a schematic diagram of an equivalent circuit of a pixel PX according to an embodiment of the disclosure. FIG. 5 illustrates a schematic cross-sectional view taken along line AA' of FIG. 1 and showing the pixel PX according to an embodiment of the disclosure.

Referring to FIG. 4, the pixel PX may include a pixel thin film transistor TRP (hereinafter, referred to as a "pixel transistor"), a liquid crystal capacitor Clc, and a storage capacitor Cst.

Hereinafter, a transistor may indicate a thin film transistor. The storage capacitor Cst may be omitted.

FIGS. 4 and 5 illustrate the pixel transistor TRP electrically connected to a gate line GL and a data line DL.

The pixel transistor TRP may output a pixel voltage corresponding to a data signal applied thereto through the data line DL in response to a gate signal applied thereto through the gate line GL.

The liquid crystal capacitor Clc may be charged with the pixel voltage output from the pixel transistor TRP. An alignment of liquid crystal directors included in the liquid crystal layer LCL (refer to FIG. 5) may be changed depending on an amount of electric charges charged in the liquid crystal capacitor Clc. The light incident into the liquid crystal layer may transmit through or may not transmit through the liquid crystal layer according to the alignment of the liquid crystal directors.

The storage capacitor Cst may be connected to the liquid crystal capacitor Clc in parallel. The storage capacitor Cst may maintain the alignment of the liquid crystal directors during a predetermined period.

As illustrated in FIG. 5, the pixel transistor TRP may include a control electrode CTE connected to the gate line GL, an active layer AL overlapping with the control electrode CTE, an input electrode IE connected to the data line DL, and an output electrode OTE disposed to be spaced apart from the input electrode IE.

The liquid crystal capacitor Clc may include a pixel electrode PE and a common electrode CE. The storage capacitor Cst may include the pixel electrode PE and a portion of a storage line STL, which may overlap or face the pixel electrode PE. The common electrode CE may receive a common voltage Vcom, and the pixel electrode PE may receive the data signal.

The gate line GL and the storage line STL may be disposed on one surface of the first substrate DS1. The control electrode CTE may be branched from the gate line GL. The gate line GL and the storage line STL may include a metal material, such as aluminum (Al), silver (Ag), copper (Cu), molybdenum (Mo), chromium (Cr), tantalum (Ta), titanium (Ti), or alloys thereof. The gate line GL and the storage line STL may have a multi-layer structure of a titanium layer and a copper layer.

A first insulating layer 10 may be disposed on the one surface the first substrate DS1 to cover the control electrode CTE and the storage line STL. The first insulating layer 10 may include at least one of an inorganic material and an organic material. The first insulating layer 10 may have a multi-layer structure of a silicon nitride layer and a silicon oxide layer.

The active layer AL may be disposed on the first insulating layer 10 to overlap or face the control electrode CTE. The active layer AL may include a semiconductor layer (not shown) and an ohmic contact layer (not shown).

The active layer AL may include amorphous silicon or polysilicon. The active layer AL may include a metal oxide semiconductor.

The output electrode OTE and the input electrode IE may be disposed on the active layer AL. The output electrode OTE and the input electrode IE may be disposed to be spaced apart from each other. Each of the output electrode OTE and the input electrode IE may partially overlap or face the control electrode CTE.

The pixel transistor TRP illustrated in FIG. 5 may have a staggered structure, however, the structure of the pixel transistor TRP may not be limited thereto. The pixel transistor TRP may have a planar structure.

A second insulating layer 20 may be disposed on the first insulating layer 10 to cover the active layer AL, the output electrode OTE, and the input electrode IE. The second insulating layer 20 may be configured as a flat surface. The second insulating layer 20 may include an organic material.

The pixel electrode PE may be disposed on the second insulating layer 20. The pixel electrode PE may be connected to the output electrode OTE via a contact hole CH defined through the second insulating layer 20. An alignment layer 30 may be disposed on the second insulating layer 20 to cover the pixel electrode PE.

A color filter layer CF may be disposed above one surface of the second substrate DS2. The common electrode CE may be disposed on one surface of the color filter layer CF. The common voltage may be applied to the common electrode CE. The common voltage may have a value different from that of the pixel voltage. An alignment layer (not shown) may be disposed on one surface of the common electrode CE to cover the common electrode CE. Another insulating layer may be disposed between the color filter layer CF and the common electrode CE.

The pixel electrode PE and the common electrode CE may form the liquid crystal capacitor Clc with the liquid crystal layer LCL interposed between the pixel electrode PE and the common electrode CE. The pixel electrode PE and the portion of the storage line STL, which may be disposed to face each other with the first and second insulating layers 10 and 20 interposed therebetween, may form the storage capacitor Cst. The storage line STL may receive a storage voltage having a value different from that of the pixel voltage. The storage voltage may have the same value as the common voltage.

The pixel PX illustrated in FIG. 5 may be a representative pixel. In other words, different from the pixel PX illustrated in FIG. 5, at least one of the color filter layer CF and the common electrode CE may be disposed on the first substrate DS1. The display panel may include a pixel driven in a vertical alignment (VA) mode, a patterned vertical alignment (PVA) mode, an in-plane switching (IPS) mode, a fringe-field switching (FFS) mode, or a plane-to-line switching (PLS) mode.

Figure 6A:
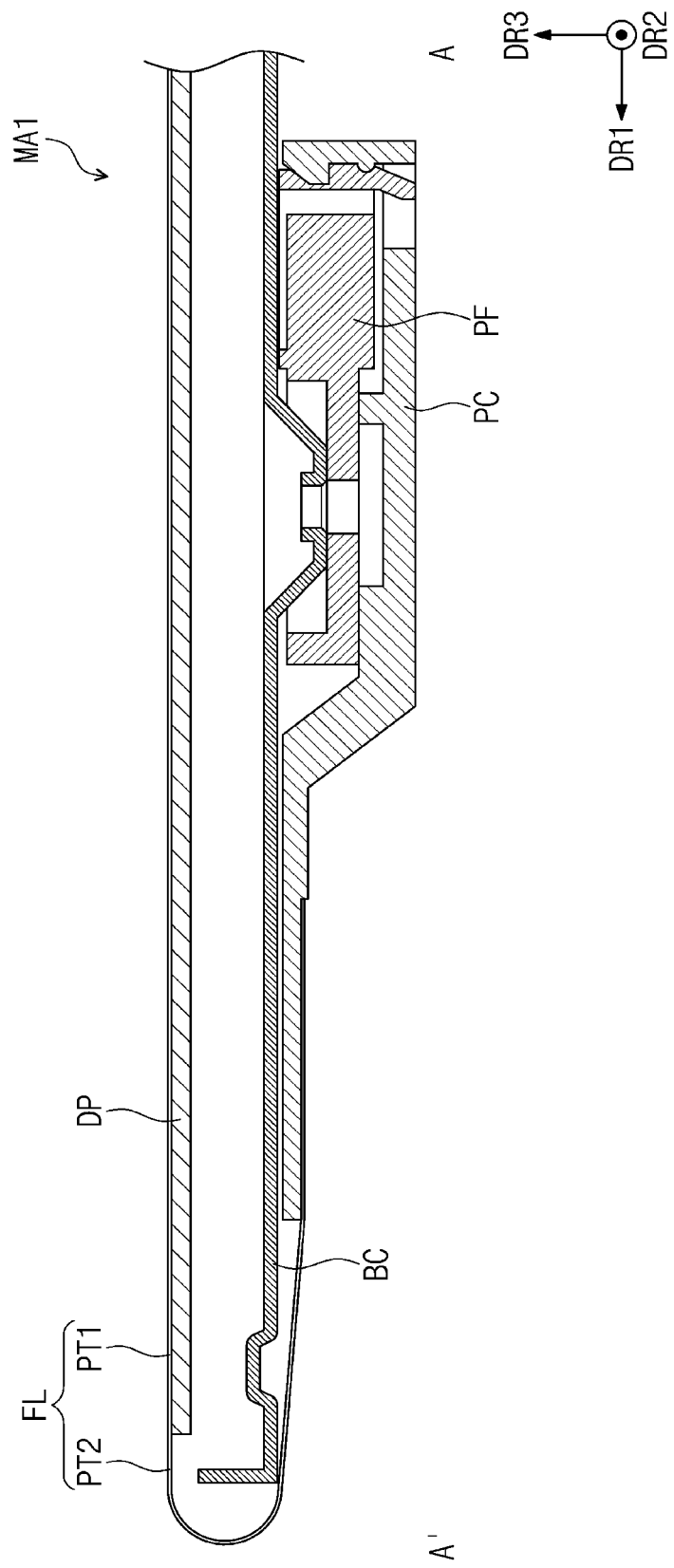
FIG. 6A illustrates a schematic cross-sectional view taken along line AA' of FIG. 1 according to an embodiment of the disclosure.
Figure 6B:
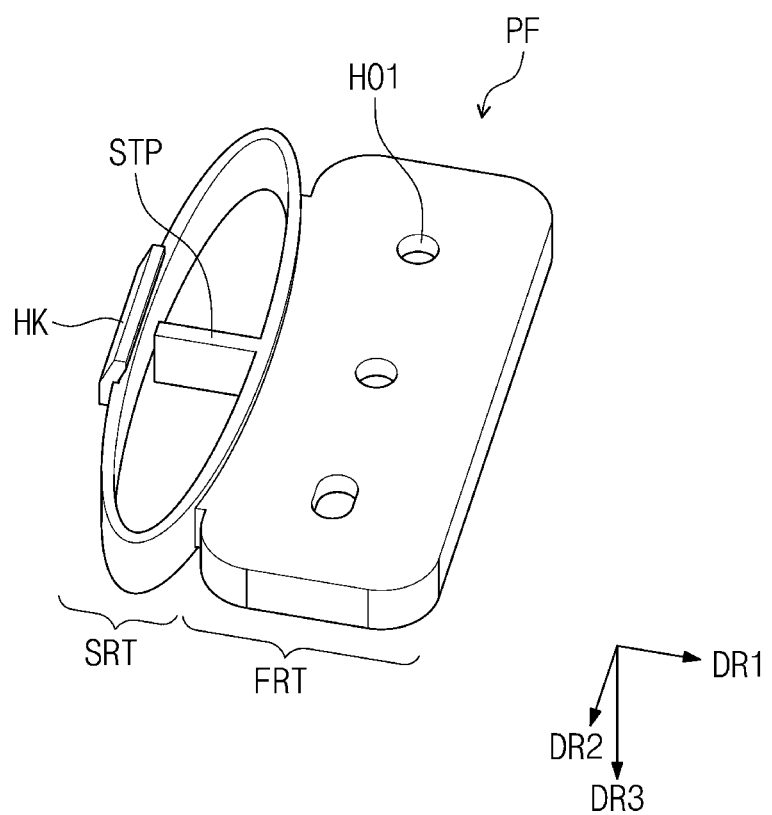
FIG. 6B illustrates a perspective view showing a pole frame according to an embodiment of the disclosure.
Figure 6C:
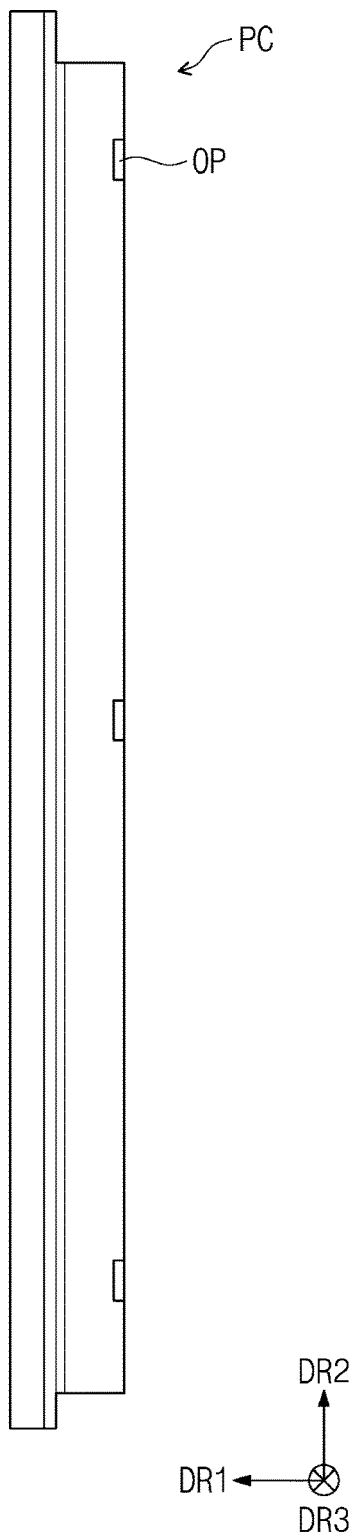
FIG. 6C illustrates a perspective view showing a pole chassis according to an embodiment of the disclosure.

FIG. 6A illustrates a schematic cross-sectional view MA1 taken along line AA' of FIG. 1 according to an embodiment of the disclosure. FIG. 6B illustrates a perspective view showing the pole frame according to an embodiment of the disclosure. FIG. 6C illustrates a view showing the pole chassis according to an embodiment of the disclosure.

Referring to FIGS. 6A to 6B, the pole frame PF may be disposed under the bottom chassis BC, and at least a portion of the pole chassis PC may be disposed under the pole frame PF. For example, the pole frame PF may be disposed between the bottom chassis BC and the portion of the pole chassis PC. The second portion PT2 of the film FL may be connected to the pole chassis PC. For example, the second portion PT2 of the film FL may be connected to the pole chassis PC by an adhesive material included in the film FL or a double-sided tape. As described above, a portion of the second portion PT2 of the film FL may extend from the first portion PT1 on the display panel DP to the pole chassis PC in a curve shape over the mold frame MD.

Referring to FIG. 6B, the pole frame PF according to the embodiment of the disclosure may include a fixing portion FRT and an elastic portion SRT. The fixing portion FRT may fix the pole frame PF to the bottom chassis BC. The fixing portion FRT may include first holes HO1. The bottom chassis BC may include a hole and protrusions (not shown) corresponding to the first holes HO1 of the fixing portion FRT. The fixing portion FRT of the pole frame PF may be fixed to the bottom chassis BC. For example, some of the first holes HO1 of the fixing portion FRT may be coupled to the protrusions (not shown) of the bottom chassis BC. The others of the first holes HO1 of the fixing portion FRT may correspond to the hole of the bottom chassis BC. A screw may be inserted into the others of the first holes HO1 of the fixing portion FRT and the hole of the bottom chassis BC respectively. The elastic portion SRT of the pole frame PF may contact the pole chassis PC and may provide a force to the pole chassis PC in a predetermined direction. The elastic portion SRT may have an elliptical shape. In a case that an external force may be applied to the elastic portion SRT, the elastic portion SRT may exert the elastic force such that a length of a short axis of the elliptical shape decreases as a length of a long axis of the elliptical shape increases. However, the aforementioned configuration and operation of the elastic portion SRT may not be limited thereto. For example, the elastic portion SRT may include a spring.

The elastic force of the elastic portion SRT may be transmitted to the pole chassis PC, via the attachment of the pole frame PF to the pole chassis PC which is discussed below. In other words, the elastic force may be a force resulting from deformation of the elastic portion SRT. Since the pole chassis PC is connected to the second portion PT2 of the film FL, the force applied to the pole chassis PC may thus be transmitted to the film FL. The second portion PT2 of the film FL may be subjected to the force in a predetermined direction. For example, the second portion PT2 of the film FL that is connected to the pole chassis PC may be subjected to the elastic force exerted by the elastic portion SRT in the predetermined direction. The predetermined direction may be a direction that is substantially parallel to a direction from the edge area AR of the display surface DA toward the center area CT of the display surface DA. In other words, the predetermined direction may be the same as the direction from the edge area AR of the display surface DA toward the center area CT of the display surface DA. In these respects, the predetermined direction may also be a direction from an outside of the display surface DA to an inside of the display surface DA. Thus, the film FL may be pulled in the direction from the first portion PT1 to the second portion PT2 as the elliptical shape of the elastic portion SRT may deform in accordance with the above-discussed decrease of its short axes and increase of its long axes.

Referring to FIG. 6B, the elastic portion SRT may include a hook HK that may extend from the elastic portion SRT to the pole chassis PC. The hook HK may be connected to the pole chassis PC. For example, the hook HK may be coupled to a coupling portion OP (refer to FIG. 6C) of the pole chassis PC. The coupling between the hook HK and the coupling portion OP will be described later in connection with the description of the pole chassis PC.

The pole frame PF may further include a stopper STP. For example, in a case that the elastic portion SRT has the elliptical shape, the stopper STP may be disposed in a direction substantially parallel to the short axis of the elliptical shape. As another example, when the elastic portion SRT includes the spring, the stopper STP may be disposed in the spring. The stopper STP may prevent the elastic portion SRT from being excessively deformed and damaged.

Referring to FIG. 6A, a portion of the pole chassis PC may be disposed under the pole frame PF. Another portion of the pole chassis PC may make contact with the bottom chassis BC. The portion of the pole chassis PC that is disposed under the pole frame PF may have a bar shape. A length measured in the second direction DR2 of the pole chassis PC may be substantially the same as a length measured in the second direction DR2 of the bottom chassis BC.

The pole chassis PC may include the coupling portion OP corresponding to the hook HK of the elastic portion SRT of the pole frame PF. As shown in FIG. 6C, the coupling portion OP may have an opening shape corresponding to the hook HK of the elastic portion SRT. The hook HK of the elastic portion SRT may be inserted into the coupling portion OP of the pole chassis PC, and thus the elastic portion SRT and the pole chassis PC may be coupled to each other.

However, the shape of the coupling portion OP may not be limited to the opening, and although not shown in figures, the coupling portion OP may include a recess shape corresponding to the hook HK of the elastic portion SRT. For example, the hook HK of the elastic portion SRT may be inserted into the OP of the pole chassis PC, and thus the elastic portion SRT and the pole chassis PC may be coupled to each other.

Accordingly, since the hook HK of the elastic portion SRT of the pole frame PF is inserted into the coupling portion OP of the pole chassis PC and the fixing portion FRT of the pole frame PF is attached to the bottom chassis BC, the elastic force of the elastic portion SRT of the pole frame PF may be exerted on the pole chassis PC to pull the second portion PT2 of the film FL that is attached to the pole chassis PC in the direction from the first portion PT1 toward the second portion PT2 of the film FL. Thus, the film FL may be properly aligned on the display panel DP to enable proper visualization of an image to be displayed on the display area DA.

Figure 7:
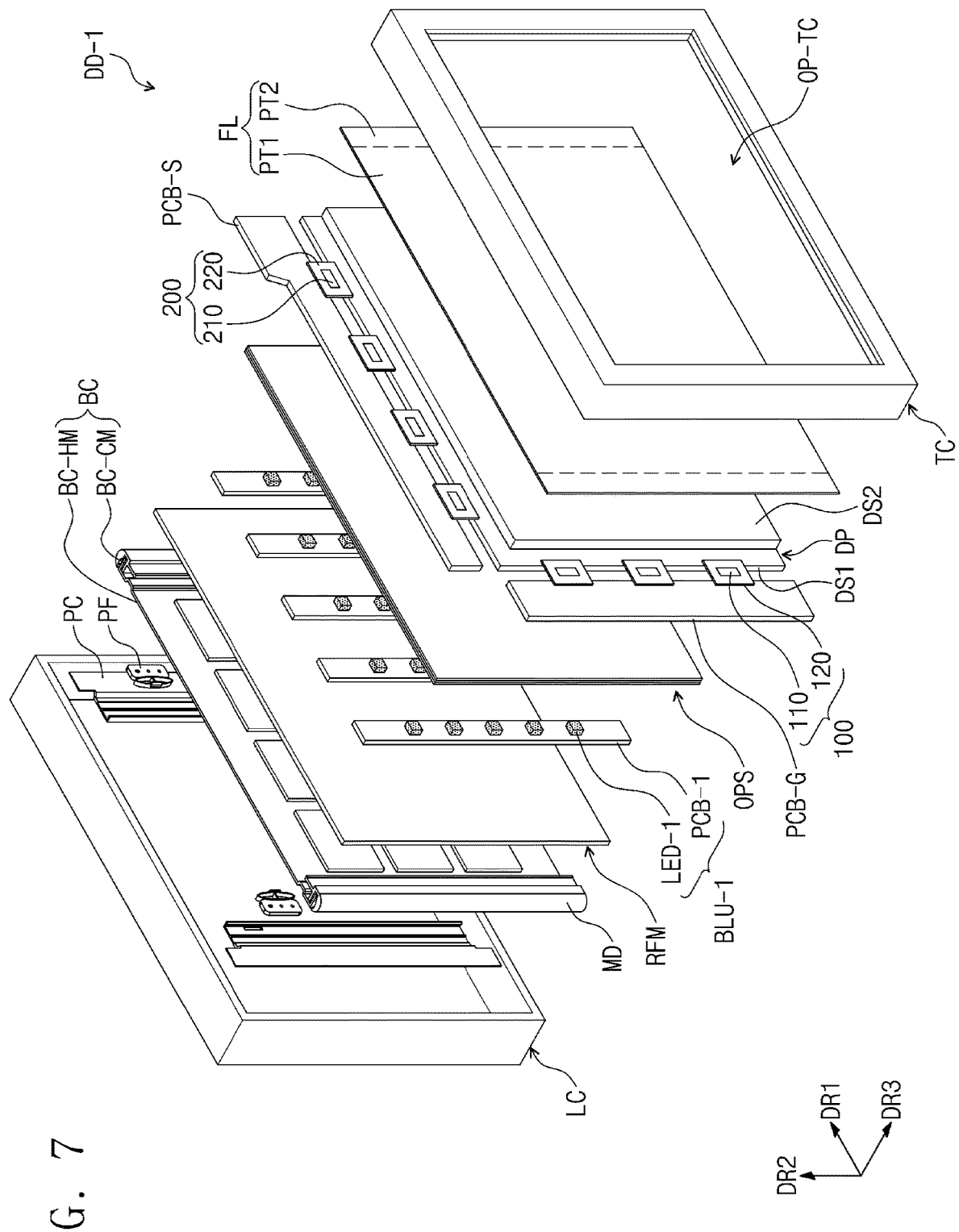
FIG. 7 illustrates an exploded perspective view showing a display device according to an embodiment of the disclosure.
Figure 8A:
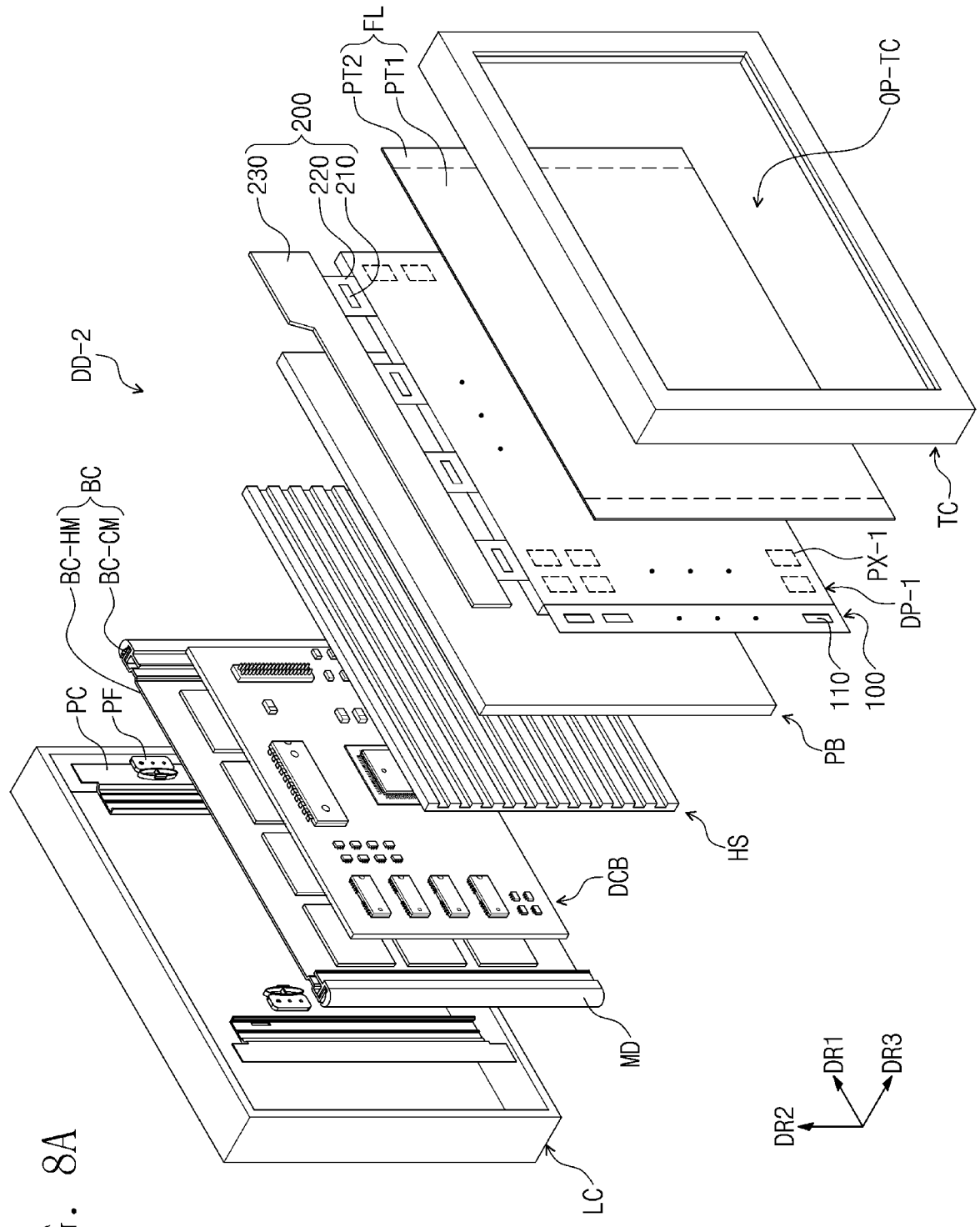
FIG. 8A illustrates an exploded perspective view showing a display device according to an embodiment of the disclosure.
Figure 8B:
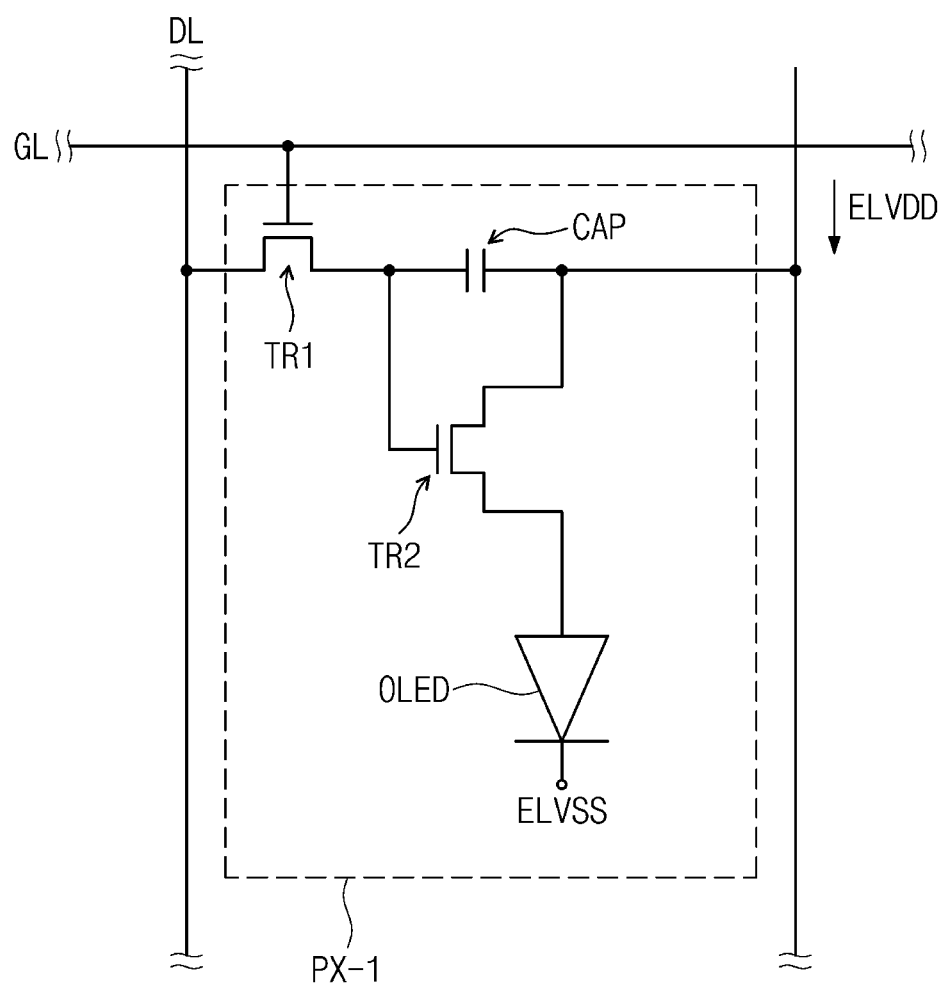
FIG. 8B illustrates a schematic diagram of an equivalent circuit of a pixel according to an embodiment of the disclosure.

FIGS. 7 and 8A illustrate exploded perspective views respectively showing display devices DD-1 and DD-2 according to an embodiment of the disclosure. FIG. 8B illustrates a schematic diagram of an equivalent circuit of a pixel PX-1 shown in FIG. 8A.

Referring to FIG. 7, different from the display device DD shown in FIG. 2, the display device DD-1 may include a direct-illumination type backlight unit BLU-1. The backlight unit BLU-1 may include point light sources LED-1 and a printed circuit board PCB-1. The backlight unit BLU-1 may be disposed on one surface of a reflective module RFM.

Referring to FIG. 8A, the display device DD-2 may include a top cover TC, a film FL, an organic light emitting display panel DP-1, a protective member PB, a heat dissipation member HS, a driving circuit board DCB, a bottom chassis BC, a mold frame MD, a pole frame PF, a pole chassis PC, and a bottom cover LC.

Although not shown in figures, the pixel PX-1 of the organic light emitting display panel DP-1 may include an anode electrode, a hole transport region, a light emission layer, an electron transport region, and a cathode electrode, which are stacked one on another.

The protective member PB may include a base layer and a heat absorbing layer. The heat absorbing layer may have an emissivity larger than that of the base layer. The heat absorbing layer may be a heat discharge layer formed of an oxide layer, a copper layer, or a heat dissipation paint.

The heat dissipation member HS may be disposed under the protective member PB. For example, the heat dissipation member HS may be disposed between the protective member PB and the driving circuit board DCB. The heat dissipation member HS may include a material having a superior heat conductivity. For example, a graphite having high heat conductivity in a plane direction may be used, however, the heat dissipation member HS may not be limited to the graphite.

In a case that the heat dissipation member HS may be disposed adjacent to the driving circuit board DCB, the heat emitted from the driving circuit board DCB and transferred to the organic light emitting display panel DP-1 may be reduced, and thus a rise in temperature of the organic light emitting display panel DP-1 may be suppressed.

The driving circuit board DCB may be disposed under the heat dissipation member HS. For example, the driving circuit board DCB may be disposed between the heat dissipation member HS and the bottom chassis BC.

The driving circuit board DCB may include circuit components, such as a timing controller. The driving circuit board DCB may generate and output signals used to drive a scan driver and a data driver, however, the driving circuit board DCB should not be limited thereto or thereby. The driving circuit board DCB may include various circuit components that generate signals required to drive the organic light emitting display panel DP-1.

Referring to FIG. 8B, the pixel PX-1 may include an organic light emitting diode OLED and a circuit part controlling the organic light emitting diode OLED. The circuit part may include a first transistor TR1, a second transistor TR2, and a capacitor CAP. However, the pixel PX-1 may not be limited to the configuration illustrated in FIG. 8B.

The first transistor TR1 may include a control electrode connected to a gate line GL, an input electrode connected to a data line DL, and an output electrode. The first transistor TR1 may output a data signal applied thereto through the data line DL in response to a gate signal applied thereto through the gate line GL.

The capacitor CAP may include a first electrode connected to the first transistor TR1 and a second electrode receiving a first power voltage ELVDD. The capacitor CAP may be charged with a voltage corresponding to the data signal provided from the first transistor TR1.

The second transistor TR2 may include a control electrode connected to the output electrode of the first transistor TR1 and the first electrode of the capacitor CAP, an input electrode receiving the first power voltage ELVDD, and an output electrode. The output electrode of the second transistor TR2 is connected to the organic light emitting diode OLED. The second transistor TR2 may control a driving current flowing through the organic light emitting diode OLED in response to the voltage charged in the capacitor CAP.

The organic light emitting diode OLED may include an anode connected to the second transistor TR2 to receive the first power voltage ELVDD and a cathode receiving a second power voltage ELVSS. The organic light emitting diode OLED may include a hole transport region, a light emission layer, and an electron transport region, which are disposed between the anode and the cathode. The organic light emitting diode OLED may emit a light during a turn-on period of the second transistor TR2.

Figure 9A:
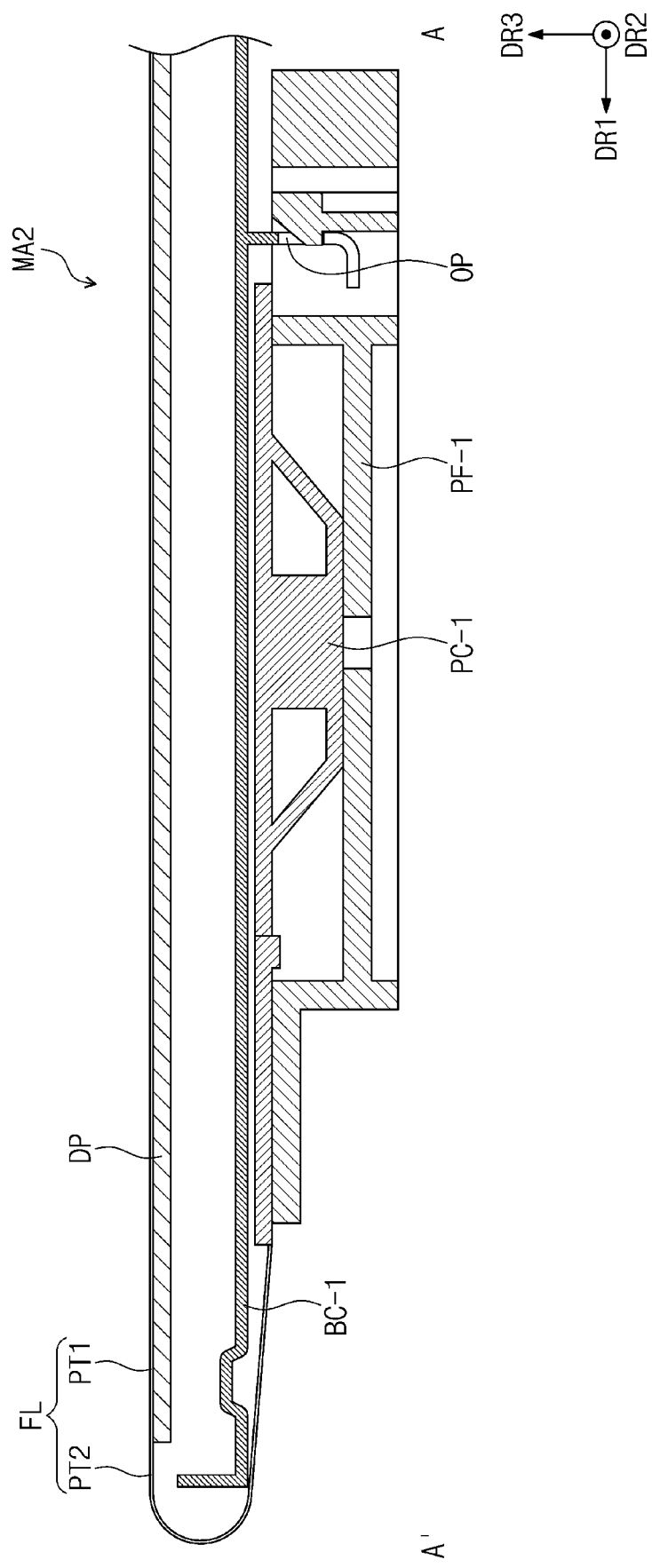
FIG. 9A illustrates a schematic cross-sectional view taken along line AA' of FIG. 1 according to an embodiment of the disclosure.
Figure 9B:
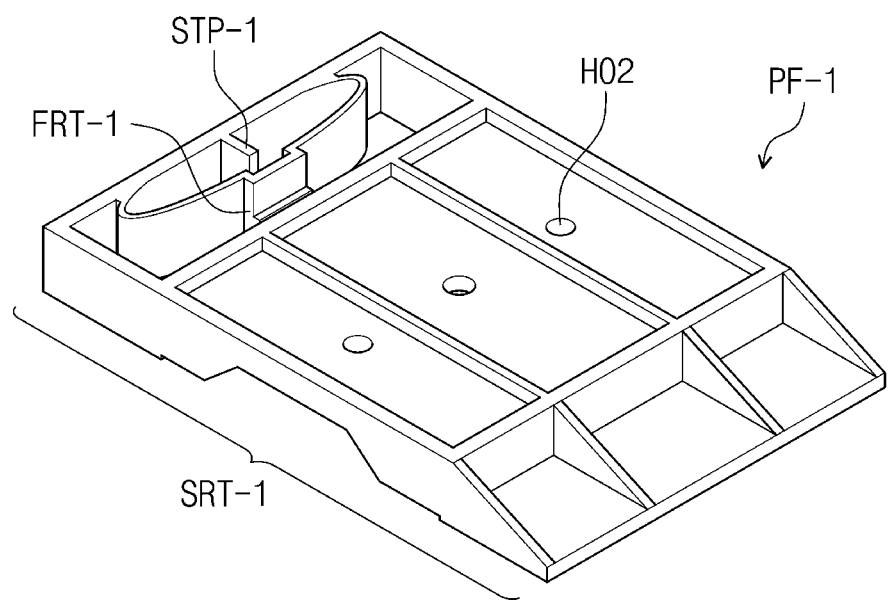
FIG. 9B illustrates a perspective view showing a pole frame according to an embodiment of the disclosure.
Figure 9B:
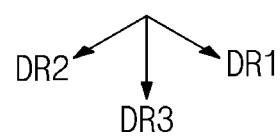
Figure 9C:
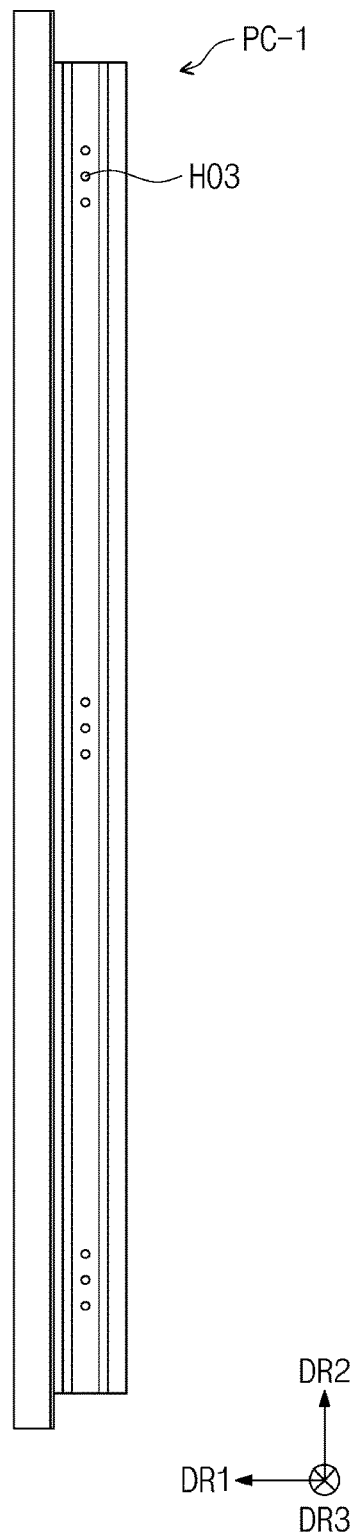
FIG. 9C illustrates a perspective view showing a pole chassis according to an embodiment of the disclosure.

FIG. 9A illustrates a schematic cross-sectional view MA2 taken along line AA' of FIG. 1 according to an embodiment of the disclosure. FIG. 9B illustrates a perspective view showing a pole frame PF-1 according to an embodiment of the disclosure. FIG. 9C illustrates a view showing a pole chassis PC-1 according to an embodiment of the disclosure.

Referring to FIGS. 9A to 9C, the pole chassis PC-1 may be disposed under a bottom chassis BC-1, and the pole frame PF-1 may be disposed under the pole chassis PC-1. For example, the pole chassis PC-1 may be disposed between the bottom chassis BC-1 and the pole frame PF-1. The second portion PT2 of the film FL extending from the display panel DP may be connected to the pole chassis PC-1.

Referring to FIG. 9B, the pole frame PF-1 may include a fixing portion FRT-1 and an elastic portion SRT-1. The fixing portion FRT-1 may fix the pole frame PF-1 to the bottom chassis BC-1. The fixing portion FRT-1 may be a hook. The fixing portion FRT-1 may be coupled to a coupling portion OP of the bottom chassis BC-1, and thus the pole frame PF-1 may be fixed to the bottom chassis BC-1.

The bottom chassis BC-1 (refer to FIG. 9A) may include the coupling portion OP corresponding to the fixing portion FRT-1. For example, the coupling portion OP of the bottom chassis BC-1 may have an opening shape extending in a downward direction from a top surface of the bottom chassis BC-1 to a lower surface thereof and corresponding to the hook of the fixing portion FRT-1. The hook that is configured as the fixing portion FRT-1 may be coupled to the coupling portion OP of the bottom chassis BC-1, and thus the fixing portion FRT-1 may make contact with the bottom chassis BC-1.

However, the coupling portion OP may not be limited to the opening, and although not shown in figures, the coupling portion OP may include a recess shape corresponding to the fixing portion FRT-1. In a case that the fixing portion FRT-1 may be coupled to the coupling portion OP of the bottom chassis BC-1, the fixing portion FRT-1 may fixedly contact the bottom chassis BC-1. That is, the pole frame PF-1 may be fixed to the bottom chassis BC-1.

Referring to FIG. 9B, the elastic portion SRT-1 may have a portion with an elliptical shape and may include second holes H02 and protrusions (not shown). The portion with elliptical shape may provide the elastic force on the pole chassis PC-1, and a portion in which the second holes H02 are defined and the protrusions (not shown) make contact with the pole chassis PC-1. Accordingly, the pole chassis PC-1 and the pole frame PF-1 may be coupled to each other by the portion of the elastic portion SRT-1. The pole frame PF-1 may further include a stopper STP-1. For example, in a case that a portion of the elastic portion SRT-1 has the elliptical shape, the stopper STP-1 may be disposed in a direciton substantially parallel to the short axis of the elliptical shape. As another example, when the elastic portion SRT-1 includes the spring, the stopper STP-1 may be disposed in the spring. The stopper STP-1 may prevent the elastic porton SRT-1 from being excessively deformed and damaged.

The pole chassis PC-1 according to the embodiment of the disclosure may be disposed between the bottom chassis BC-1 and the pole frame PF-1. Referring to FIG. 9C, the pole chassis PC-1 may make contact with the elastic portion SRT-1 of the pole frame PF-1. The pole chassis PC-1 may be provided with third holes HO3 defined therein.

Some third holes of the third holes HO3 of the pole chassis PC-1 may be coupled to the protrusions (not shown) of the elastic portion SRT-1. Others of the third holes HO3 of the pole chassis PC-1 may correspond to the second holes HO2 of the elastic portion SRT-1. A screw may be inserted into the other third holes and the second holes HO2 of the elastic portion SRT-1.

Figure 10A:
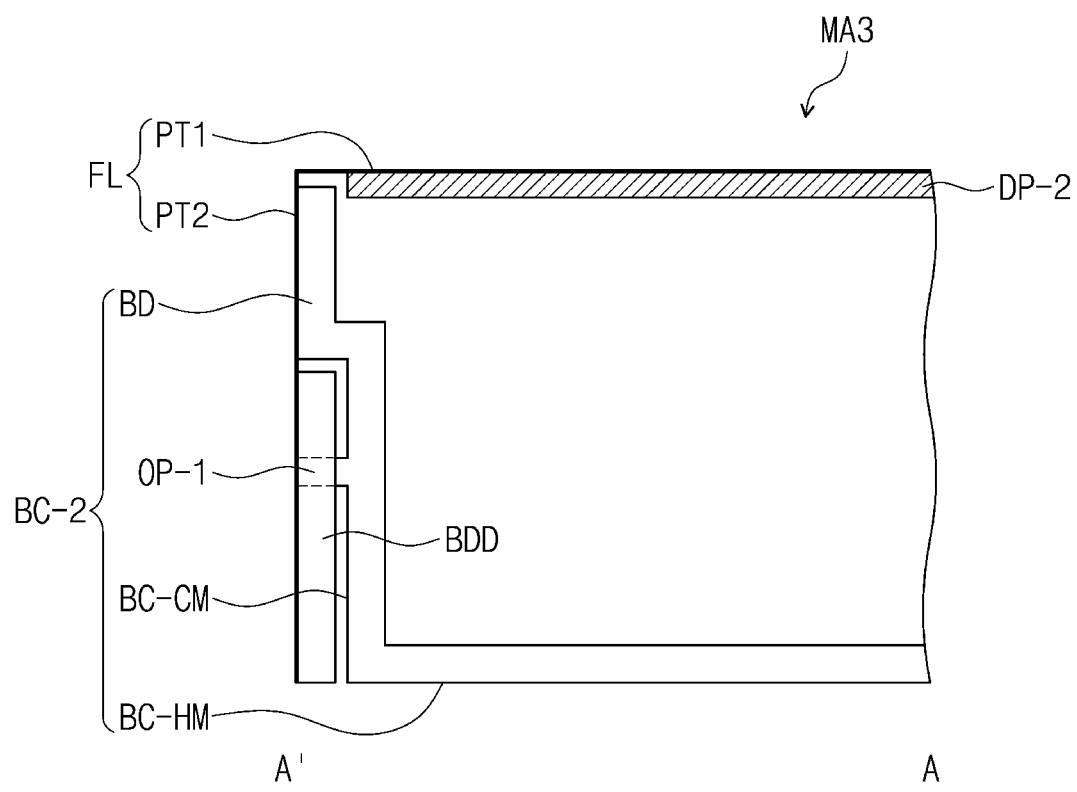
FIG. 10A illustrates a schematic cross-sectional view taken along line AA' of FIG. 1 according to an embodiment of the disclosure.
Figure 10A:
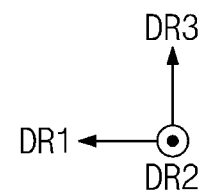
Figure 10B:
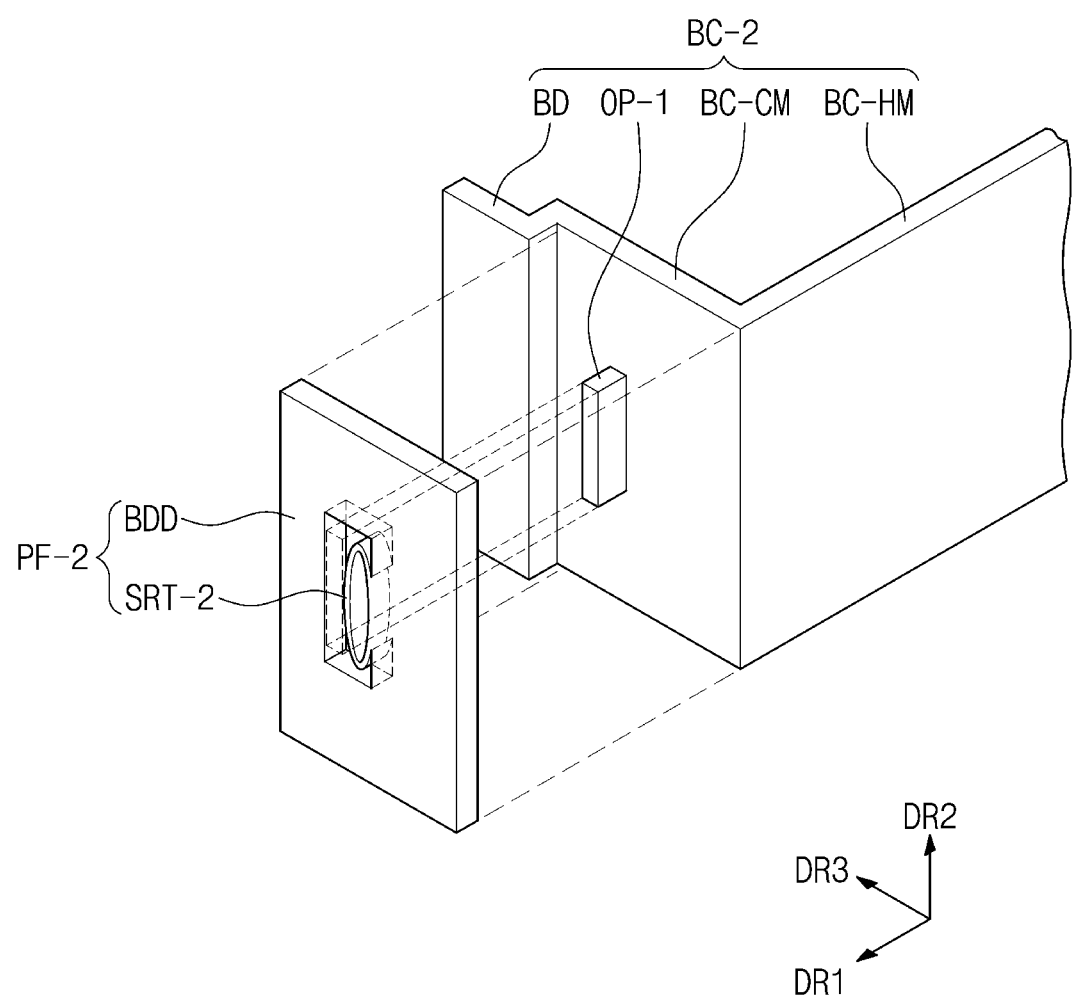
FIG. 10B illustrates an exploded perspective view showing a portion of a display device according to an embodiment of the disclosure.

FIG. 10A illustrates a cross-sectional view MA3 taken along line AA' of FIG. 1 according to an embodiment of the disclosure. FIG. 10B illustrates an exploded perspective view showing a portion of a display device according to an embodiment of the disclosure.

Referring to FIGS. 10A and 10B, the second portion PT2 of the film FL may be connected to a pole frame PF-2, and the pole frame PF-2 may be disposed on a side surface BC-CM of a bottom chassis BC-2. The display device according to the embodiment may not include a pole chassis PC. Since the pole chassis PC disposed under the bottom chassis BC-2 is omitted, a thickness of the display device may be reduced.

According to the embodiment, at least a portion of the side surface BC-CM may include a convex portion BD. The convex portion BD may extend from the side surface BC-CM and may make contact with the second portion PT2 of the film FL. A length measured in the first direction DR1 of the convex portion BD may be substantially the same as a length measured in the first direction DR1 of the pole frame PF-2. A step difference on the side surface BC-CM of the bottom chassis BC-2, which is caused by the pole frame PF-2, may be reduced by the convex portion BD. In other words, since the step difference may represent a distance from a lower surface of the side surface BC-CM to an upper surface thereof, the convex portion BD may have a same step difference as another portion of the side surface BC-CM.

According to the embodiment of the disclosure, the pole frame PF-2 may include an elastic portion SRT-2 and a body portion BDD. The body portion BDD may surround or be around a periphery of the elastic portion SRT-2 of the pole frame PF-2 and a coupling portion OP-1 of the bottom chassis BC-2 that is inserted in a space between the body portion BDD and the plastic portion SRT-2. The pole frame PF-2 may not include the stopper STP. Since the body portion BDD surrounds the elastic portion SRT-2, the elastic portion SRT-2 may be prevented from being excessively deformed, as a result.

The bottom chassis BC-2 may include the coupling portion OP-1 protruding in a direction substantially parallel to the first direction DR1. The elastic portion SRT-2 of the pole frame PF-2 may be coupled to the coupling portion OP-1 of the bottom chassis BC-2 as the coupling portion OP-1 may be inserted within the opening of the elastic portion SRT-2. The elastic portion SRT-2 may exert an elastic force due to the coupling portion OP-1 of the bottom chassis BC-2 being inserted within the elastic portion SRT-2. The elastic portion SRT-2 may transmit the elastic force to the body portion BDD. The elastic portion SRT-2 may have an elliptical shape. The second portion PT2 of the film FL may be coupled to the body portion BDD. For example, the body portion BDD may be coupled to the second portion PT2 by an adhesive material included in the film FL. As another example, the body portion BDD may be coupled to the second portion PT2 by a separate adhesive member.

The body portion BDD may provide the elastic force, that is provided from the elastic portion SRT-2, to the second portion PT2 of the film FL. For example, the second portion PT2 may receive a force in a direction extending toward a lower area of the display panel DP-2 due to the elastic force of the elastic portion SRT-2 being exerted upon the body portion BDD to which the second portion PT2 is attached. In other words, the second portion PT2 may be pulled from an upper area of the display panel DP-2 to a lower area thereof to align the film FL along a side the display panel DP-2.

Figure 11:
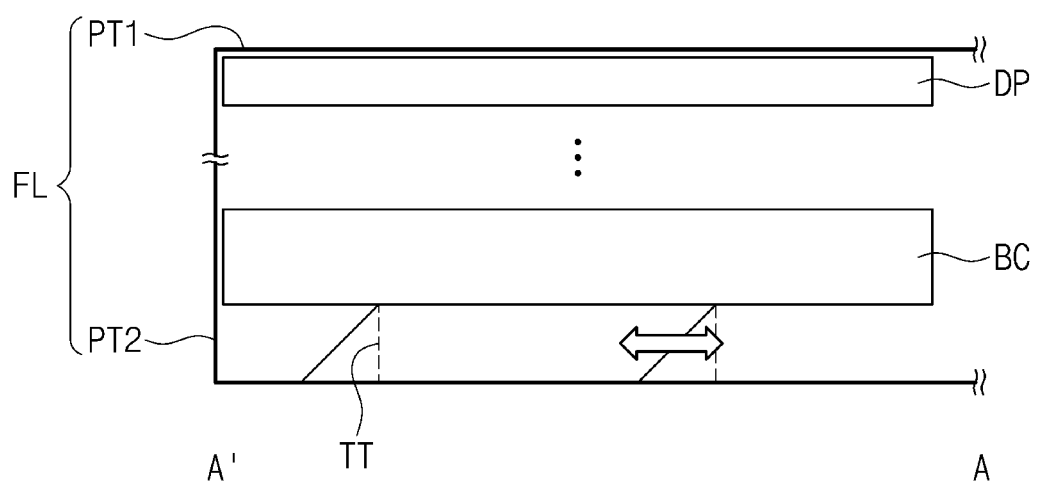
FIG. 11 illustrates a schematic cross-sectional view taken along line AA' of FIG. 1 according to an embodiment of the disclosure.
Figure 11:
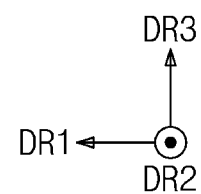

FIG. 11 illustrates a schematic cross-sectional view showing a portion of the cross-section taken along line AA' and corresponding to one side of the display device DD shown in FIG. 1.

The display device DD according to an embodiment of the disclosure may include a foam tape TT disposed between the bottom chassis BC and a second portion PT2 of the film FL. For example, the second portion PT2 of the film FL may be attached to the foam tape TT, and the foam tape TT may be attached to the bottom chassis BC.

The foam tape TT may include an acrylic-based adhesive. The acrylic-based adhesive may be disposed on front and rear surfaces of the foam tape TT. The foam tape TT may absorb and offset impacts such as external vibration. A thickness of the foam tape TT may be equal to or greater than about 0.5 mm and equal to or smaller than about 1.0 mm.

Although the embodiments of the disclosure have been described, it may be understood that the disclosure may not be limited to these embodiments and that various changes and modifications may be made by one ordinary skilled in the art within the spirit and scope of the disclosure as hereinafter claimed. Therefore, the disclosed subject matter may not be limited to any single embodiment described herein, and the scope of the disclosure may be determined according to the attached claims.

What is claimed is:

1. A display device, comprising:
    a display panel comprising a display surface on which an image is displayed;
    a first chassis disposed under the display panel;
    a first frame disposed under the first chassis and comprising a fixing portion fixed to the first chassis and an elastic portion extending from the fixing portion in a first direction, the elastic portion being hollow;
    a second chassis coupled with the elastic portion; and a film comprising a first portion disposed on the display panel and a second portion extending from the first portion and coupled to the second chassis, wherein the elastic portion of the first frame comprises a hook that extends in a second direction perpendicular to the first direction, wherein the first frame further comprises a stopper disposed spaced-apart in the first direction between the fixing portion and the hook, wherein the stopper is disposed within a hollow region of the hollow elastic portion, and wherein one side of the stopper, which is opposite to an other side of the stopper in the first direction, is directly connected to a first side of the elastic portion, and the other side of the stopper is spaced apart from the elastic portion, the stopper being configured to abut directly a second side of the elastic portion when the elastic portion is deformed under compressive force.

2. The display device of claim 1, wherein the elastic portion exerts a force in the first direction on the second chassis.

3. The display device of claim 2, wherein the display surface comprises a center area and an edge area disposed around the center area, and the first direction is substantially parallel to a direction from the edge area toward the center area.

4. The display device of claim 1, wherein the second chassis comprises a coupling portion corresponding to the hook and in which the hook couples the elastic portion of the first frame to the coupling portion of the second chassis.

5. The display device of claim 1, wherein the film comprises a polarizing film that polarizes a light incident thereto.

6. The display device of claim 1, further comprising a backlight unit disposed between the display panel and the first chassis, and wherein the display panel comprises a liquid crystal layer.

7. The display device of claim 6, wherein the backlight unit comprises:

a light guide member comprising a front surface substantially parallel to the display surface, a rear surface opposite to the front surface, and a plurality of side surfaces connecting the front surface and the rear surface; and a light source disposed adjacent to a first side surface among the side surfaces, and the film is disposed around a second side surface extending from the first side surface among the side surfaces.

8. The display device of claim 1, wherein the hook is disposed at the second side of the elastic portion.

9. The display device of claim 1, wherein the stopper and elastic portion are integrally formed.

10. The display device of claim 1, wherein the fixing portion, the elastic portion, the stopper, and the hook are integrally formed.

11. A display device, comprising:

a display panel comprising a display surface on which an image is displayed;

a first chassis disposed under the display panel;

a first frame disposed under the first chassis and comprising a fixing portion fixed to the first chassis and an elastic portion extending from the fixing portion, the elastic portion being hollow;

a second chassis receiving an elastic force from the elastic portion in a first direction; and a film comprising a first portion disposed on the display panel and a second portion extending from the first portion and coupled to the second chassis, wherein the elastic portion of the first frame comprises a hook that extends in a second direction, perpendicular to the first direction, wherein the first frame further comprises a stopper disposed spaced-apart in the first direction between the fixing portion and the hook, and wherein one side of the stopper, which is opposite to an other side of the stopper in the first direction, is directly connected to a first side of the elastic portion and the other side of the stopper is spaced apart from the elastic portion, the stopper being configured to abut directly a second side of the elastic portion when the elastic portion is deformed under compressive force.

12. The display device of claim 11, wherein at least a portion of the elastic portion of the first frame is coupled with the second chassis.

13. The display device of claim 11, wherein the display surface comprises a center area and an edge area disposed around the center area, and the first direction is substantially parallel to a direction from the edge area toward the center area.

14. The display device of claim 11, wherein the second chassis comprises a coupling portion corresponding to the hook and in which the hook couples the elastic portion of the first frame to the coupling portion of the second chassis.

* * * * *